(12) United States Patent
Carter et al.

(10) Patent No.: US 8,081,671 B2
(45) Date of Patent: Dec. 20, 2011

(54) OPTOELECTRONIC DEVICE AND METHOD OF OPERATING OPTOELECTRONIC DEVICE

(75) Inventors: Andrew Cannon Carter, Northamptonshire (GB); Michael Moser, Baden (CH)

(73) Assignee: Oclaro Technology Limited, Northamptonshire (GB)

( * ) Notice: Subject to any disclaimer, the term of this patent is extended or adjusted under 35 U.S.C. 154(b) by 206 days.

(21) Appl. No.: 12/059,111

(22) Filed: Mar. 31, 2008

(65) Prior Publication Data

US 2008/0247436 A1 Oct. 9, 2008

(30) Foreign Application Priority Data

Apr. 3, 2007 (GB) .................................. 0706584.0

(51) Int. Cl.
*H01S 5/00* (2006.01)
(52) U.S. Cl. ............. 372/50.21; 372/50.23; 372/50.124; 372/50.11; 372/50.1
(58) Field of Classification Search ............... 372/50.21, 372/50.23, 50.124, 50.11, 50.1
See application file for complete search history.

(56) References Cited

U.S. PATENT DOCUMENTS

| 5,633,527 | A  | * | 5/1997  | Lear .............................. 257/432 |
| 6,583,445 | B1 | * | 6/2003  | Reedy et al. .................... 257/82 |
| 6,748,003 | B1 |   | 6/2004  | Knopp et al. |
| 7,376,169 | B2 | * | 5/2008  | Henrichs ......................... 372/99 |
| 2003/0035454 | A1 |   | 2/2003 | Hwang et al. |
| 2005/0041715 | A1 | * | 2/2005 | Kim ................................. 372/50 |
| 2005/0259097 | A1 | * | 11/2005 | Lehoty et al. ................. 345/207 |
| 2005/0286593 | A1 |   | 12/2005 | Guenter |

FOREIGN PATENT DOCUMENTS

JP 2000-349392 12/2000
WO 2006/074011 7/2006

OTHER PUBLICATIONS

British Search Report for corresponding Application No. GB0706584.0 dated Aug. 2, 2007.

* cited by examiner

*Primary Examiner* — Kinam Park
(74) *Attorney, Agent, or Firm* — Patterson & Sheridan, L.L.P.

(57) ABSTRACT

The invention provides an optoelectronic device combining a vertical cavity surface emitting laser (VCSEL) and a photodetector for monitoring the output power of the vertical cavity surface emitting laser. To improve the signal-to-noise ratio of the photodetector, a light deflector is interposed between the photodetector and the VCSEL.

21 Claims, 3 Drawing Sheets

OPTOELECTRONIC DEVICE AND METHOD OF OPERATING OPTOELECTRONIC DEVICE

CROSS-REFERENCE TO RELATED APPLICATION

This application claims priority under 35 U.S.C. §119 to British Patent Application GB 0706584.0, filed Apr. 3, 2007, the entire disclosure of which is incorporated herein by reference.

FIELD OF THE INVENTION

The present invention generally relates to optoelectronic devices, and more specifically to optoelectronic devices having a vertical cavity surface emitting laser (VCSEL) using a light receptive device such as a photodiode for light intensity output monitoring.

BACKGROUND OF THE INVENTION

Vertical cavity surface emitting lasers are well known to the person skilled in the art. Such lasers have become useful devices for a variety of applications, for instance, in telecommunications, optical property sampling and measurement technology, such as in spectrometers, or in optical position detection devices, such as optical encoders or in optical computer mice.

The VCSEL is a very attractive device for an optical light source suitable for mass production, in that a large number of VCSELs can be simultaneously fabricated on a single wafer by well established process technology. The VCSELs can, additionally, be provided with integrated circuitry associated and operable for driving the VCSEL. Therefore, VCSELs are very attractive candidates for providing low cost laser light sources for a variety of applications, including those mentioned above.

In some of these applications of a laser light source, it may be very important to precisely monitor the output power generated by the VCSEL. This requirement is addressed in US 2005/0286593, in which a monitor photodiode is monolithically integrated beneath a VCSEL, being sandwiched between the VCSEL and the substrate. The VCSEL is comprised of an active layer sandwiched between two distributed Bragg reflectors (DBR) acting as the cavity mirrors for the laser. The DBR mirrors on both sides of the active layers are highly reflective, but still allow a small percentage of radiation of about 0.5% to pass through so as to be able to emit light through the top of the device, and also to allow some light to pass down to the photodiode. The photodiode is integrated on top of the substrate, followed by a tunnel diode, on top of which the VCSEL is formed. The document addresses the problem of reducing the amount of spontaneous emission that reaches the photodiode. As a solution, it is suggested to provide layers in the bottom DBR mirror with a high gallium fraction, the amount thereof being optimized such that these layers become heavily absorbing below the lasing wavelength. Thus, in order to suppress the amount of spontaneous emission that is detected by the photo detector, this teaching exploits the difference in bandwidth between the narrow bandwidth coherent laser light and the broad bandwidth spontaneous emission light, in order to preferentially absorb the latter.

Due to its cavity being formed by plane mirrors generated by DBRs, the vertical cavity surface emitting laser cannot employ so-called "stable resonators" which would require concavely curved mirror surfaces. Instead, the resonator of the VCSEL is just at the edge of stability, wherein stable operation can only be obtained due to the very short length of the cavity and of the active medium. The more the cavity of a laser fulfills the stability criterion the higher is the percentage of coherent emission.

At the lasing threshold the amount of spontaneous emission emitted from a VCSEL may be quite substantial, in the range of 1 percent or even more of the laser total output power at a typical laser power level of about 1 mW, which is a typical operating level for a VCSEL, for instance, in a pointing device such as a computer mouse.

Such high levels of spontaneously emitted incoherent light, have a broader bandwidth than the coherently emitted laser light, and thus is less efficiently reflected by the DBRs, providing a high amount of noise and thus a substantial error source for the proper detection of the output power of the laser.

Additionally, if the laser and photodiode are integrated, either monolithically or in a hybrid manner, further reflecting surfaces are provided which back-reflect radiation from the photodiode into the laser cavity, thereby causing unwanted alteration of the laser properties in an uncontrolled way. Inevitable variation of the substrate thickness, substrate surface roughness, variation of the thickness of the layers of the photodiode, or, as in the case of the arrangement according to US 2005/0286593 A1 of the intermediate tunnel diode, will cause an undefined phase of the light reflected back into the laser cavity, thereby disturbing the light modes amplified within the laser cavity.

Accordingly, it is the object of the present invention to provide a new and improved optoelectronic device overcoming the aforementioned problems of the prior art and allowing precise monitoring the output power of the optoelectronic device without disturbing the efficiency and performance of the generation of laser light output from the vertical cavity surface emitting laser.

SUMMARY OF THE INVENTION

According to the present invention, this problem is solved by an optoelectronic device comprising a substrate, a vertical cavity surface emitting laser formed on the substrate, wherein the vertical cavity surface emitting laser comprises an active layer sandwiched between an output side Bragg mirror and a non-output side Bragg mirror, and such that the intensity of light emitted through the output side Bragg mirror is greater than that emitted through the non-output side Bragg mirror, a light receptive device to receive and detect light emitted through the non-output side mirror of the VCSEL, wherein, further, a light deflector is interposed between the light receptive device and the non-output side Bragg mirror of the VCSEL, wherein the light deflector is effective to deflect light emitted through the non-output side Bragg mirror so as to reduce the amount of light received by the light receptive device having a propagation direction with an inclination to an axis of the laser cavity of the VCSEL.

The invention advantageously uses a light deflector between the VCSEL and the light receptive device, to increase the angle of divergence of incident light that is divergent from the axis of the optical laser cavity. This exploits a difference in the optical properties of light emitted by spontaneous emission and stimulated emission. Spontaneously emitted light has a substantially homogeneous distribution of propagation directions, while coherently emitted laser light is substantially parallel to the axis of the cavity of the laser. Thus, off-axis beams of spontaneously emitted light are deflected so as to no longer be received by the light receptive device, while the stimulated emission laser light is transmitted through the light deflector substantially unimpaired. This reduces the level of spontaneously emitted light received by the light receptive device, which may be an output power monitor. In addition, back reflection of spontaneously emitted light from the light receptive device and the substrate surface is also suppressed, so that disturbing effects in the laser cavity due to out-of-phase back reflection of spontaneous light emission are reduced.

In an embodiment of the invention, the light deflector is formed by a curved surface structure formed between the non-output side mirror and the light receptive device, wherein the curved surface structure defines a transition in index of refraction. With such a curved surface structure for the light deflector, a simple and easy to realize means is provided for deflecting off-axis light rays. In addition, the deflection becomes more efficient with an increase in the amount of an inclination angle of a propagation direction of the light ray relative to the cavity axis. Thus, as the light deflector is curved, on-axis radiation, or radiation propagating in a narrow angle region around the cavity axis, which is typical for stimulated emission light from the VCSEL, passes substantially unhindered and undeflected through the light deflector, while off-axis light from the spontaneous emission is deflected. If the angle of incidence of the spontaneously emitted light at a surface portion of the curved surface of the light deflector is larger than a critical angle, depending on the difference of index of refraction at both sides of the curved surface structure, total internal reflection of the respective light occurs, thereby completely eliminating such spontaneously emitted light from the light received and detected by the light receptive device.

As viewed from the side of the VCSEL, the light deflector has an optically concave shaped structure which can be easily formed by etching the respective layer of the laser device, preferable the bottom of the substrate, onto which the light receptive device is to be added.

In a further embodiment of the present invention, the light deflector is shaped as a plano-convex lens-type structure. Such a structure can be easily fabricated, for instance, by deposition of a surface tension exhibiting fluid of optical transparency having a different index of refraction as compared to the adjacent material layers. Such a material can, for example, be optically transparent glue. Due to the convex shaped surface, the off-axis rays of the spontaneously emitted light are deflected further away from the axis of the laser cavity by refraction at the transition surface from the lens-type structure to the ambient environment, such as, for instance, vacuum, air or another gas.

In yet another embodiment, the light deflector is a multi-facet structure. This provides the advantage that it is possible to design a minimum angle value of inclination, for which the off-axis rays are deflected, while rays of a lesser angle of inclination are transmitted without any deflection. This can be realized by providing a plane center surface parallel to the Bragg reflector and aligned to the optical cavity, and having sloped side surfaces, preferentially with a very shallow slope, which may, for instance, be formed by an anisotropic etch in the bulk of the substrate with a lateral etch rate much greater than a vertical etch rate.

In yet a further embodiment, the deflector is formed by a material recess allowing easy realization by etching the respective device layer.

Preferentially, the light receptive device is a photodiode which can be easily integrated into the optical device, or can be easily fabricated in a hybrid fashion with the VCSEL.

In yet another embodiment, the VCSEL is a top-emitting laser, and the substrate on which the VCSEL is formed is interposed between the non-emitting side mirror of the VCSEL and the light receptive device. This allows the particularly advantageous and simple manufacture of hybrid devices in which a separately manufactured light receiving device, such as a photodiode, is later attached to the substrate of the VCSEL.

In yet another embodiment of the optoelectronic device according to the invention, the light deflector comprises an angle selective coating layer structure. Such an angle selective coating layer structure may be an interference-type reflector which is highly transparent for light rays of a predefined wavelength propagating parallel to the optical axis of the laser, but is at least partially reflective for light that is divergent from the axis of the laser cavity, with the reflectivity increasing with the angle of divergence. Such a structure provides the advantage that the range of angles for which the coating is reflective can be precisely engineered by well-known coating technology. It could also serve the purpose of providing an anti-reflection means thereby preventing unwanted back-reflection of any light emitted by the laser back into the cavity, which will inevitably have an undefined phase relative to the laser modes due to the generally imprecise thickness of the substrate. To even further improve the performance of this embodiment, a plurality of such angle selective coating layer structures could be provided.

In yet another embodiment of the optoelectronic device according to the invention, the device is formed as a hybrid structure, wherein the light receptive device is bonded to the substrate on which the VCSEL is formed. Since alignment between the VCSEL and the light receptive device is not critical, such a hybrid assembly could be achieved with great cost efficiency. Further cost effectiveness could be obtained by using flip-chip technology that is readily available for such semiconductor technology.

In yet another embodiment of the optoelectronic device according to the present invention, the relative orientation of the VCSEL and light receptive device is such that the output side Bragg mirror is disposed between the non-output side Bragg mirror and the substrate, and the non-output side Bragg mirror is disposed between the output side Bragg mirror and the light receptive. Thereby, the VCSEL is formed as a back-side emitting VCSEL, emitting through the substrate on which it is formed, and wherein the photoreceptive device is formed on the top of the VCSEL over the non-emitting mirror, which in this embodiment can then be formed in an integrated manner thereby eliminating the often manually performed steps of bonding the photoreceptive device to the respective laser.

In yet another embodiment of the optoelectronic device according to the present invention, the light receiving device comprises part of a monolithically integrated electrical circuit. Thereby, added functionality can be provided on the chip of the light receiving device, so that data acquisition, conditioning and processing, can be done at the same location providing easy and efficient access to the control data.

In yet another embodiment of the optoelectronic device according to the present invention the laser and the light receptive device are formed as separate devices joined together by a hybrid technology. In this embodiment it is for instance possible that the bonding be performed either by solder bonding or by bonding using electrically conductive resin. Thus, electrical connection between the VCSEL and the light receptive device is provided so that drive, control and data signals can be transferred from one chip to the other.

According to yet another embodiment of the optoelectronic device according to the invention, the VCSEL has a beam size, and the light deflector has a lateral extension between two to four times greater than the respective lateral extension of the beam size. Preferably, the beam size has a cross-sectional diameter in the range of 2 to 20 µm and, in addition thereto, the light receiving area of the light receptive device is larger than a width of the beam emitted by the VCSEL, and is preferably more than five times larger than the width of the beam. Thereby, alignment of the light receptive device relative to the cavity of the VCSEL is non-critical and can be performed in a cost efficient manner.

In the following, the present invention will be described on the basis of an illustrative example with reference to the accompanying drawings. This description of a specific embodiment is for purely illustrational purposes only and shall not be construed to limit the subject of the invention in any manner.

BRIEF DESCRIPTION OF THE DRAWINGS

In the accompanying drawings.

DETAILED DESCRIPTION OF THE INVENTION

Figure 1:
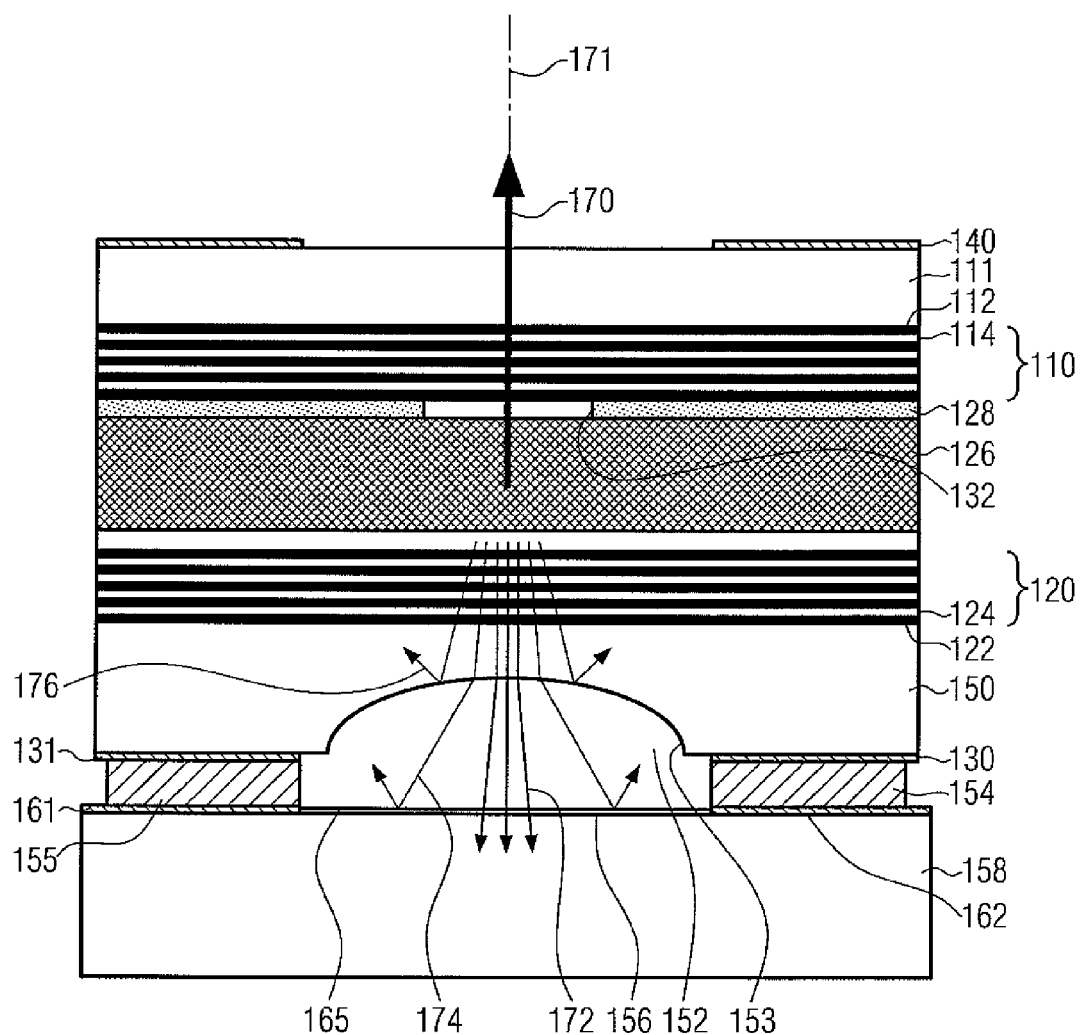
FIG. 1 shows a cross-sectional view of a hybrid-type optoelectronic device according to the present invention.

FIG. 1 shows an optoelectronic device according to the present invention. The optoelectronic device comprises a vertical cavity surface emitting laser (VCSEL) which is formed of an active layer 126 sandwiched between an upper distributed Bragg reflector (DBR) 110 formed of a stack of layers 112 and 114 with different index of refraction, and a lower distributed Bragg reflector 120 formed of another stack of layers of different indices of refraction 122 and 124. An aperture layer 128 is formed between the upper distributed Bragg reflector 20 and the active layer 126. The aperture layer may be formed of a partially oxidized AlGaAs layer. The central unoxidized portion of the AlGaAs layer 128 comprises an electrical aperture 132. The surrounding oxidized portion of the AlGaAs layer 128 comprises an isolation region. This arrangement provides a constriction of the electrical drive current passing through the laser. The aperture 132 has an approximate diameter of about 2 to 20 µm. On top of the upper distributed Bragg reflector 110 is provided a passivation layer 111, on top of which an electrode 140 is provided, which is preferentially ring-shaped and provides an output window for a laser beam 170 emitted along the optical axis of the vertical cavity surface emitting laser. The laser beam 170 is substantially parallel with the optical axis 171 of the laser cavity.

The VCSEL composed of the elements described above is formed on a substrate 150. A light receptive device such as a photodiode 158 is attached to the bottom side of substrate 150, opposite the non-emitting distributed Bragg reflector of the VCSEL. The photodiode 158 may have a coating 156 on its surface adjacent to the substrate 150. The photodiode 158 is for instance glued to the bottom side of the substrate with adhesive layers 154 and 155, which may be one of optically transparent adhesive, solder or electrically conductive adhesive. The photodiode has a light receptive surface opposed to the substrate with a lateral dimension at least 10 times greater than the aperture in the aperture layer, preferably more than 20 times greater.

On the bottom side of the substrate, facing towards the photodiode and substantially in alignment with the aperture 132 formed in the aperture layer 128, a recess 152 is formed having a curved surface structure centered approximately on the central axis 171 of the VCSEL's laser cavity. The recess 152 preferably has a lateral extension greater than the lateral extension of the incident beam of light, and more preferably between 2 and 4 times greater than the lateral extension of the beam of light. In the case of top emitting VCSEL the beam of light may be approximately equal in width with the aperture. In the case of a bottom emitting VCSEL (i.e. the output beam passes through the substrate), the beam of light may be substantially wider than the aperture.

Electrodes 130 can be provided at the bottom side of the substrate. Further electrodes 161 and 162 may be provided on the top side of the photodiode, so as to allow electrical connections from the substrate 150 to the photodiode 158 in combination with using electrically conductive bonding, for instance by electrically conductive adhesive layers 154 and 155, or by using solder bonds instead of the adhesive layers 154 and 155.

The recess 152 can be formed by standard patterning technologies, using photoresists, together with photolithography and well known etching techniques. A surface 153 of the recess 152 can take a plurality of shapes, such as a half-lentoid shape as shown in FIG. 1, or a fractional spherical shape, or a fractional cylindrical shape with an axis parallel with the bottom of the substrate.

Yet further alternatives for the light deflector are possible under the subject of the invention. The deflecting element may be may be formed as a diffractive element at the bottom surface of the VCSEL carrying substrate, such as a Fresnel zone plate. Other designs of refractive element may be employed for the deflector, such as a Fresnel lens. The latter types of deflectors provide the advantage of freedom in design and of readily available process technology known from photolithographic semiconductor patterning.

The light deflector could also be formed as any type of optically concave structure, for instance by transformation of an optical property of the substrate material, as may for instance be done by ion implantation.

The operation of the optoelectronic device shown in FIG. 1 is as follows. In operation the VCSEL emits a strong output beam of stimulated emission laser light 170, which may be at wavelengths greater than 900 nm, for instance at about 960 nm. A small proportion of the light generated in the laser cavity also is emitted through the bottom DBR 120 as a monitor beam, typically being about 0.3 to 2 percent of the intensity of the output beam 170. The laser light, due to stimulated coherent emission, is substantially of a single longitudinal mode and comprises a low number of transverse modes, thereby achieving strong directivity along the optical axis 171 of the cavity of the laser coinciding with the emission direction 170. The on-axis laser light emitting through the back DBR mirror 120 passes across the interface in the recess 152 providing a transition from the substrate material 150, with a higher index of refraction $n_s$, to the material between the substrate 150 of the VCSEL and the photodiode 158 with a lower index of refraction $n_a$. In the embodiment of FIG. 1 the lower refractive index material may be vacuum, air or another gas, with an index of refraction of approx. $n_a=1$. At this interface, due to the transition from material with high index of refraction to material with low index of refraction, the curved surface of the recess has the function of a dispersive lens, so that off-axis rays of light are refracted to diverge from the optical axis at a greater angle. Thereby, and considering the very large thickness of the substrate 150 (the figures are not to scale) relative to the width of the lasing cavity, which is typically narrower than 20 μm (while the substrate has a thickness of approximately 500 μm), even slightly deflected central rays of the laser will, once reflected at a surface of the photodiode or layers within the photodiode, are no longer able to couple back into the cavity of the laser. Thereby, back-reflection of the laser light from the photodiode into the laser cavity is greatly reduced.

Off-axis rays of a high angle of divergence, which are associated with spontaneously emitted light such as ray 176, strike the surface 153 of the interface of the recess 152 at a relatively large angle to the perpendicular and are subject to total internal reflection, preventing such light from passing across the boundary of the recess and thus cannot reach the photodiode.

Off-axis rays of intermediate divergence, which are also associated with spontaneously emitted light such as ray 174, may pass through the interface of the recess, but are strongly deflected due to refraction at the transition, and are subsequently at least partially reflected at the top surface of the photodiode. This reflection can be increased if the photodiode is provided with a coating layer 156, which is preferentially angularly selective so as to preferentially transmit light with smaller angles of divergence from the axis of the laser cavity.

Figure 2:
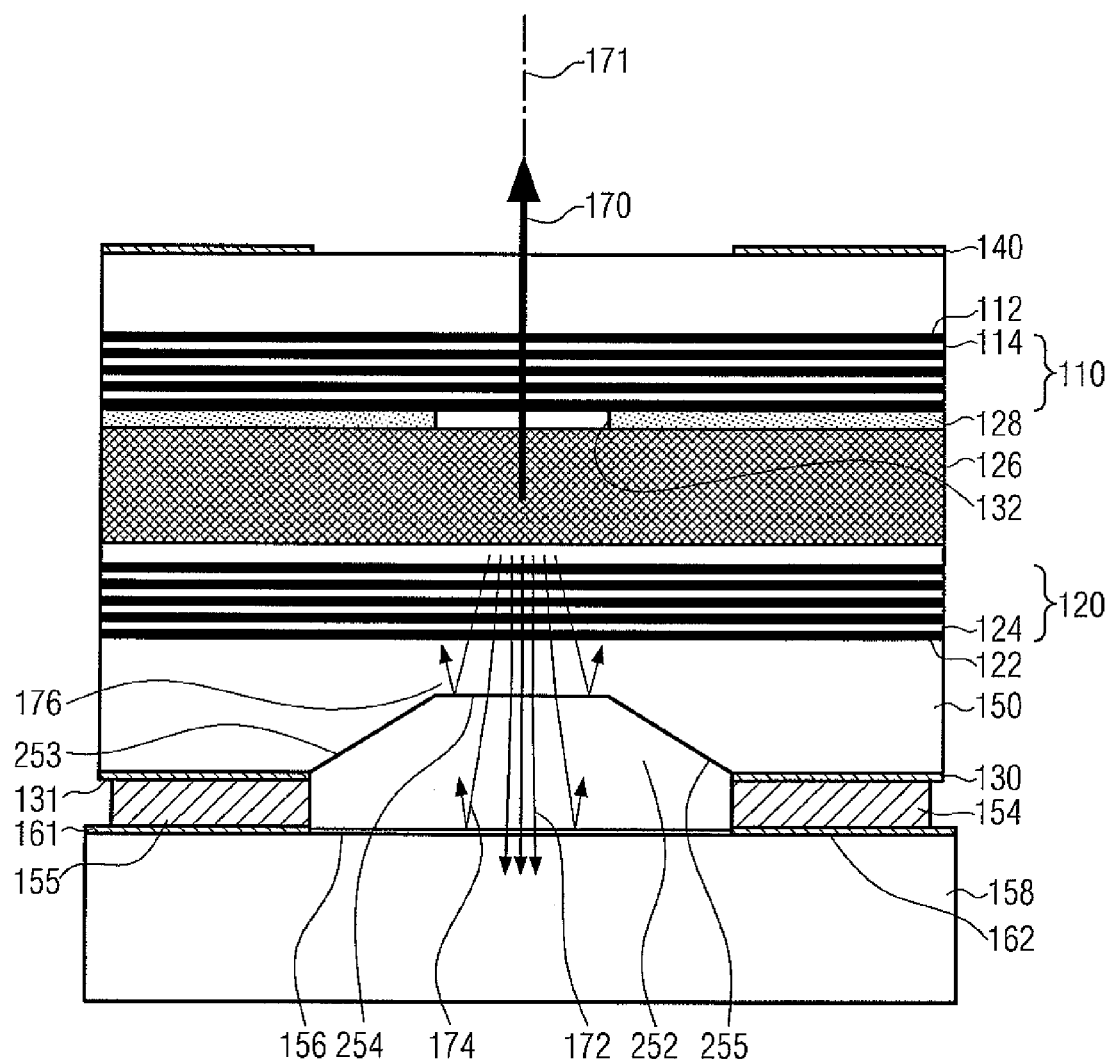
FIG. 2 illustrates an alternative embodiment of the hybrid-type optoelectronic device having a different type of light deflector.

FIG. 2 shows a second embodiment of the optoelectronic device according to the present invention. The same elements shown in FIG. 2 are identified with the same numerals as in FIG. 1, and a description thereof is provided in relation to that figure.

The recess 252, serving as the light deflecting element, is formed as a multi-facet concave structure in the embodiment according to FIG. 2. This multi-facet structure comprises a central plane surface 254 which is parallel to the layers of the DBR mirror 120 and perpendicular to the light emitting direction 170 and the laser axis 171. The plane surface 254 of the multi-facet structure may have approximately the same dimension as the width of the laser cavity and the size of the corresponding beam of coherent light, which is typically less than or equal to 20 μm. Laterally adjacent sloping surfaces 253 and 255 are substantially plane surfaces with a relatively small slope of only a few degrees with respect to the plane surface 254, but of sufficient inclination so that light rays emitted by spontaneous emission of light from within the central aperture 132 of the aperture layer 128 and impinging on the sloping surfaces are subject to total internal reflection. The person skilled in the art is aware of the required degree of inclination which can be calculated from Snell's law of refraction, in the limit of total internal reflection, $$\sin a_T = n_2/n_1 \quad (1)$$

wherein $a_T$ is the critical angle of incidence for total internal reflection (relative to the perpendicular to the interface), where $n_1$ is the higher refractive index of the substrate, and $n_2$ is the lower refractive index of the adjacent material, e.g. a layer of glue 154. By appropriate choice of the material adjacent to the recess 252 within the substrate 150, a small critical angle $a_T$ can be realized. Preferably, and without being limited to the embodiment of FIG. 2, the material adjacent to the recess will have a refractive index that is at least 1.5 times smaller than the index of refraction of the substrate, preferably at least 2 times smaller, most preferably at least 3 times smaller. For instance, if the material in which the light deflector is formed is a semiconductor substrate, and the material adjacent thereto is vacuum, air or a gas, then the latter may have a refractive index that is less than a third of the refractive index of the substrate.

Since the substrate 150 is approximately 500 μm thick (not drawn in scale), while the laser cavity and corresponding coherent beam widths are typically in the range 2 to 20 μm, the amount of divergence of the coherent beam at the position of the recess can be substantially neglected for the calculation of the inclination angle of the side facet surfaces 253 and 255. Similar side surfaces (not visible in the sectional view of FIG. 2) of the multi-facet layer with same or similar inclinations to the cavity axis 170 are arranged at directions so as to be adjacent to the edges of surfaces 254, 253 and 255. Such faceted surfaces may be formed by an etching technology using a highly anisotropic etch, having a greatly increased lateral etch rate over the etch rate into the bulk of the substrate.

Figure 3:
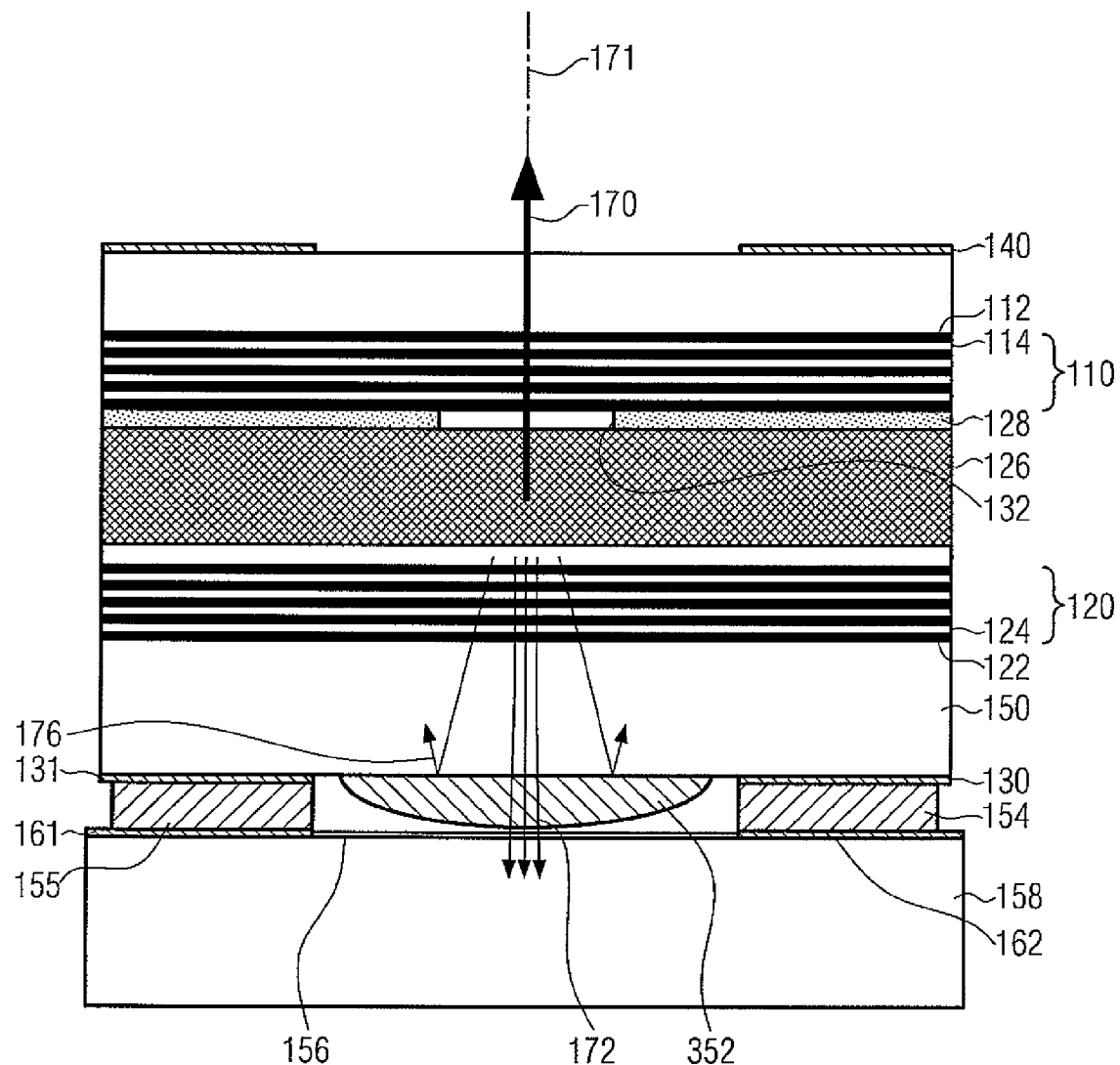
FIG. 3 shows yet a further alternative embodiment of the optoelectronic device according to the present invention with yet another type of light deflector.

FIG. 3 shows yet another embodiment of the optoelectronic device according to the present invention. Again, the same elements shown in FIG. 3 are identified with the same numerals as in FIG. 1, and a description thereof is provided in relation to that figure.

The light deflector device according to the embodiment shown in FIG. 3 is provide by a planoconvex-type lens structure 352, which may preferentially be formed by a material which is liquid in an application state and exhibits a surface tension to thereby automatically form a curved surface. The material, after solidifying, will then provide the lens-type structure. A suitable material could be optically transparent glue. The same material can be used to bond the photodiode 158 to the substrate 150 of the VCSEL via adhesive layers 154 and 155. Preferentially, an electrically conductive glue material is used for the adhesive layers 154 and 155, so that the photodiode 158 can be electrically connected via backside contacts 130 and 131 provided at the bottom side of the substrate 150 with the circuitry of the VCSEL.

If electrical connections are to be provided, the adhesive layers 154 and 155 may alternatively be formed as solder bumps.

Various modifications of the optoelectronic device shown in FIGS. 1 to 3 are possible. For instance, the vertical cavity surface emitting laser may be a backside emitting laser, and the photodiode may be added to the VCSEL by flip-chip bonding to the top surface of the VCSEL structure.

In a further modification, it is possible to integrate a plurality of coating layers on top of the photodiode so as to increase the angle selectivity of the coating element at the surface of the photodiode.

The optoelectronic device according to the present invention is most advantageously applied for optical positioning devices, such as a computer mouse. The optoelectronic device can be manufactured in a very cost efficient manner and is, thus, viable for mass production. The size of the chip of the VCSEL is preferably as small as 250 um, preferably even smaller between 150 um and 50 um. Thereby, cost saving in production of the device can be achieved.

The invention claimed is:
1. An optoelectronic device comprising:
a substrate, a vertical cavity surface emitting laser (VCSEL) formed on the substrate, the VCSEL comprising an active layer sandwiched between an output side Bragg mirror and a non-output side Bragg mirror and such that the intensity of light emitted through the output side Bragg mirror is greater than that emitted through the non-output side Bragg mirror,
a light receptive device to receive and detect light emitted through the non-output side mirror of the VCSEL, and a light deflector is interposed between the light receptive device and the non-output side mirror of the VCSEL, the light deflector being effective to deflect light emitted through non-output side Bragg mirror to reduce the amount of light received by the light receptive device having a propagation direction with an inclination to an axis of the laser cavity of the VCSEL, wherein the light deflector comprises at least one of a curved surface structure formed between the non-output side Bragg mirror and the light receptive device, the curved surface structure defining a transition in the index of refraction, an optically concave multifaceted structure, and an angle selective coating layer wherein light propagating in a narrow angle region around a cavity axis of the VCSEL passes through the light deflector, and off-axis light is deflected at the light deflector.

2. An optoelectronic device according to claim 1, wherein the light deflector is an optically concave shaped structure.

3. An optoelectronic device according to claim 1, wherein the light deflector is an optically planoconvex shaped lens-type structure.

4. An optoelectronic device according to claim 1, wherein the deflector is formed by a material recess in a device layer interposed between the non-output side mirror of the VCSEL and the light receptive device.

5. An optoelectronic device according to claim 1, wherein the light receptive device is a photodiode.

6. An optoelectronic device according to claim 1 comprising a plurality of angle selective coating layer structures.

7. An optoelectronic device according to claim 1, wherein the light receptive device is bonded to the VCSEL forming a hybrid integrated structure.

8. An optoelectronic device according to claim 7, wherein the bonding comprises solder bonds or electrically conductive adhesive.

9. An optoelectronic device according to claims 7, wherein the bonding comprises optically transparent adhesive.

10. An optoelectronic device according to claim 1, wherein the light receptive device is a component in an integrated electrical circuit.

11. An optoelectronic device according to claim 1, wherein the relative orientation of the VCSEL and the light receptive device is such that the non-output-side Bragg mirror is disposed between the output side Bragg mirror and the substrate, and the substrate is disposed between the non-output side Bragg mirror and the light receptive device.

12. An optoelectronic device according to claim 11, wherein the light receptive device is bonded to the substrate on which the VCSEL is formed.

13. An optoelectronic device according to claim 1, wherein the relative orientation of the VCSEL and light receptive device is such that the output side Bragg mirror is disposed between the non-output side Bragg mirror and the substrate, and the non-output side Bragg mirror is disposed between the output side Bragg mirror and the light receptive device.

14. An optoelectronic device according to claim 13, wherein a top surface of the VCSEL is bonded to the light receptive element by flip-chip bonding.

15. An optoelectronic device according to claim 1, wherein the light deflector is formed by an interface between adjacent materials with a refractive index ratio at the emitting wavelength of at least 1.5, preferably at least 2 and more preferably at least 3.

16. An optoelectronic device according to claim 1, wherein the VCSEL has a beam size with a first lateral extension, and the light deflector has a second lateral extension, wherein the second lateral extension is between 2 and 4 times greater than the first lateral extension.

17. An optoelectronic device according to claim 16, wherein the beam size has a cross sectional diameter in a range of 2 to 20 μm.

18. An optoelectronic device according to claim 1, wherein a width of a light receiving area of the light receptive device is larger than a width of the beam emitted by the VCSEL, preferably larger than 10 times the width of the beam.

19. An optical positioning device comprising an optoelectronic device according to claim 1.

20. An optical positioning device according to claim 19, wherein the positioning device is a computer mouse.

21. An optoelectronic device according to claim 1, wherein the light deflector comprises an optically concave multifaceted structure, the optically concave multifaceted structure comprising:
   a central plane surface that is substantially perpendicular to the cavity axis of the VCSEL; and
   a plurality of sloping surfaces adjacent the central plane surface that are substantially plane surfaces with a slope with respect to the central plane surface.

* * * * *